(12) United States Patent
Fujiwara et al.

(10) Patent No.: US 12,425,000 B2
(45) Date of Patent: Sep. 23, 2025

(54) LOW VELOCITY SURFACE ACOUSTIC WAVE DEVICE

(71) Applicant: SKYWORKS SOLUTIONS, INC., Irvine, CA (US)

(72) Inventors: Joji Fujiwara, Suita (JP); Riho Sasaki, Hirakata (JP); Kyohei Kobayashi, Otsu (JP); Noriaki Amo, Sanda (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 440 days.

(21) Appl. No.: 17/879,116

(22) Filed: Aug. 2, 2022

(65) Prior Publication Data

US 2023/0043197 A1    Feb. 9, 2023

Related U.S. Application Data

(60) Provisional application No. 63/228,774, filed on Aug. 3, 2021.

(51) Int. Cl.
*H03H 9/02* (2006.01)
*H03H 9/64* (2006.01)

(52) U.S. Cl.
CPC .... *H03H 9/02834* (2013.01); *H03H 9/02992* (2013.01); *H03H 9/6483* (2013.01)

(58) Field of Classification Search
CPC ............ H03H 9/02; H03H 9/145; H03H 9/25; H03H 9/64
See application file for complete search history.

(56) References Cited

U.S. PATENT DOCUMENTS

| | | | |
|---|---|---|---|
| 7,772,742 B2 * | 8/2010 | Kando | H03H 9/02834 310/346 |
| 7,863,801 B2 * | 1/2011 | Kadota | H03H 9/02834 310/313 R |
| 9,640,750 B2 * | 5/2017 | Nakanishi | H03H 9/02834 |
| 9,673,779 B2 | 6/2017 | Ruile et al. | |
| 10,469,050 B2 | 11/2019 | Gamble et al. | |
| 10,763,813 B2 * | 9/2020 | Nakamura | G01L 9/0025 |
| 10,938,371 B2 | 3/2021 | Nakamura et al. | |
| 11,095,269 B2 * | 8/2021 | Komatsu | H03H 9/72 |
| 11,652,466 B2 * | 5/2023 | Fujiwara | H03H 9/25 333/193 |

(Continued)

*Primary Examiner* — Andrea Lindgren Baltzell
*Assistant Examiner* — Alan Wong
(74) *Attorney, Agent, or Firm* — Lando & Anastasi, LLP

(57) ABSTRACT

A low velocity surface acoustic wave device, and a method of reducing the velocity of a surface acoustic wave generated by a surface acoustic wave device are described, the device including a piezoelectric layer, an interdigital transducer disposed on the piezoelectric substrate and configured to generate a surface acoustic wave in response to an electrical, and a temperature coefficient of frequency compensation layer disposed partially on the interdigital transducer and partially on the piezoelectric substrate, the temperature coefficient of frequency compensation layer having a low velocity layer disposed within it configured to reduce the velocity of a surface acoustic wave generated by the interdigital transducer, the method including disposing a wave velocity adjustment layer, the wave velocity adjustment layer being a low velocity layer, within a temperature compensation layer of the surface acoustic wave device.

22 Claims, 13 Drawing Sheets

(56) References Cited

U.S. PATENT DOCUMENTS

| | | | |
|---|---|---|---|
| 11,705,883 B2* | 7/2023 | Hiramatsu | H03F 3/72 |
| | | | 333/193 |
| 11,936,367 B2* | 3/2024 | Fukuhara | H03H 9/25 |
| 2009/0058225 A1* | 3/2009 | Kadota | H03H 9/0222 |
| | | | 310/313 B |
| 2018/0054179 A1 | 2/2018 | Gamble et al. | |
| 2019/0386642 A1* | 12/2019 | Komatsu | H03H 9/14541 |
| 2020/0162052 A1 | 5/2020 | Matsuoka et al. | |
| 2021/0126616 A1* | 4/2021 | Hiramatsu | H03H 9/14541 |
| 2021/0135654 A1* | 5/2021 | Fukuhara | H03H 9/1457 |

* cited by examiner

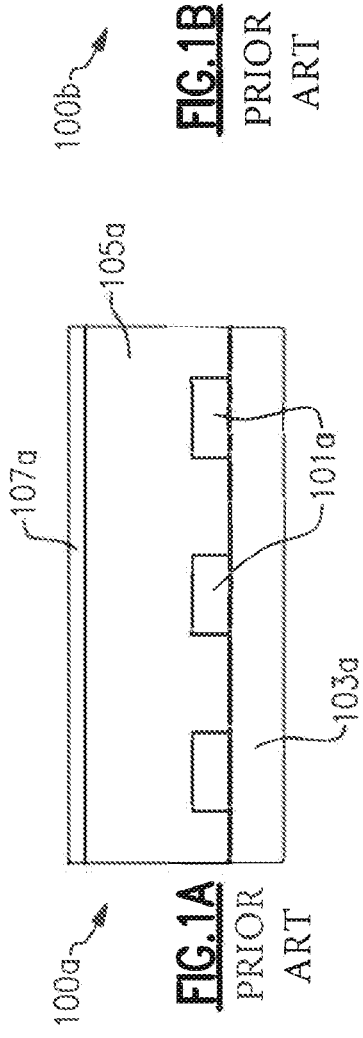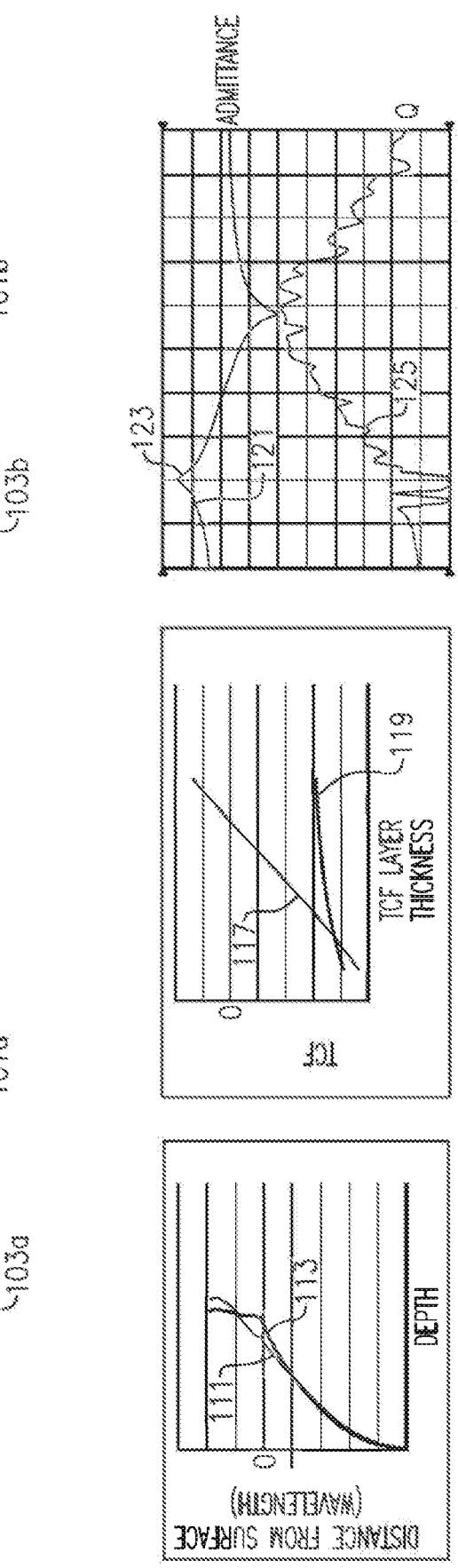

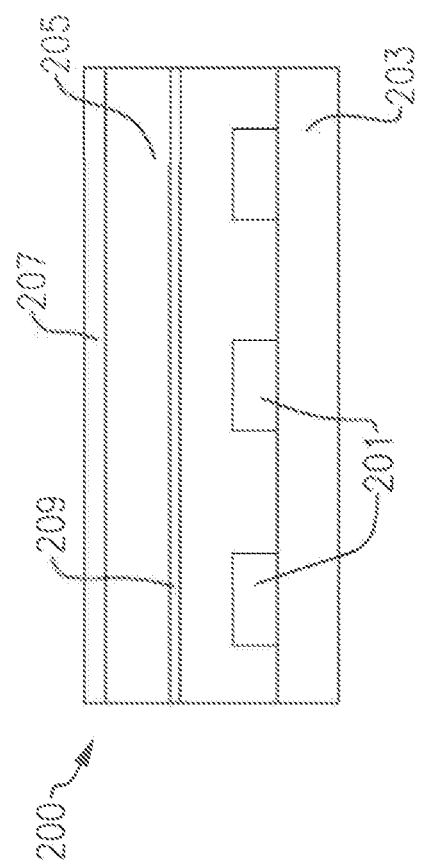
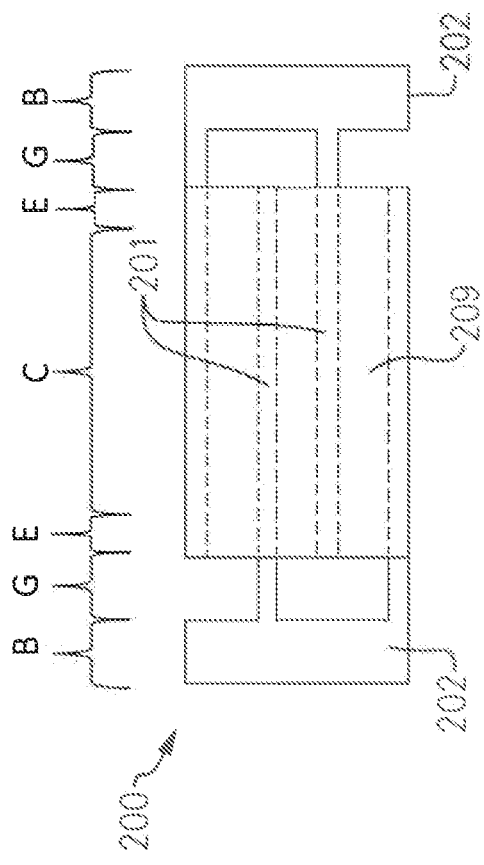
FIG. 2A
FIG. 2B

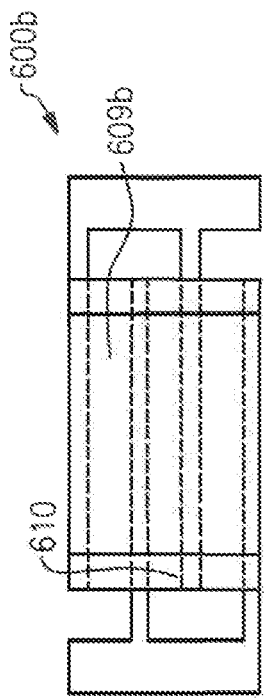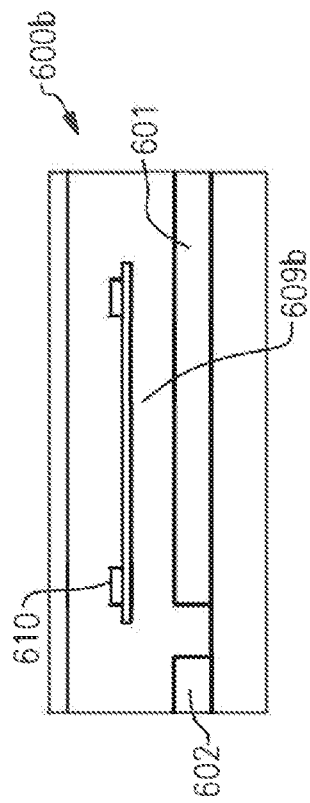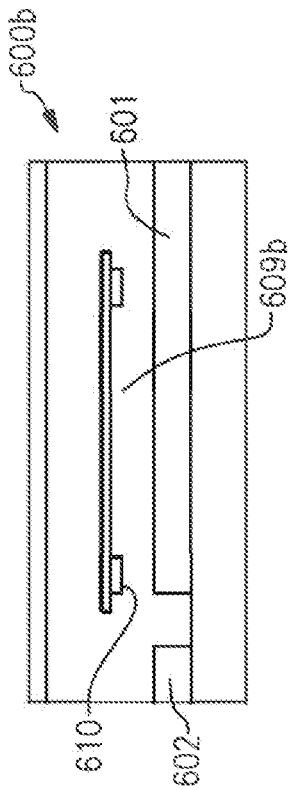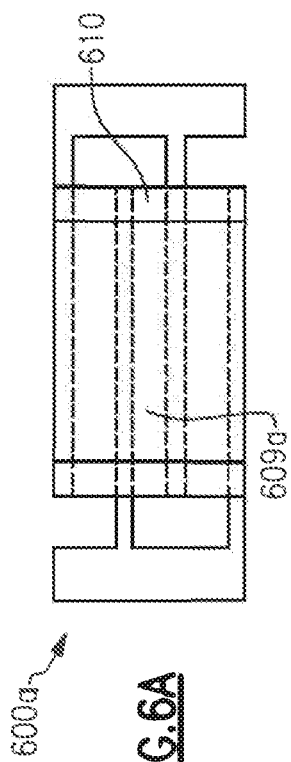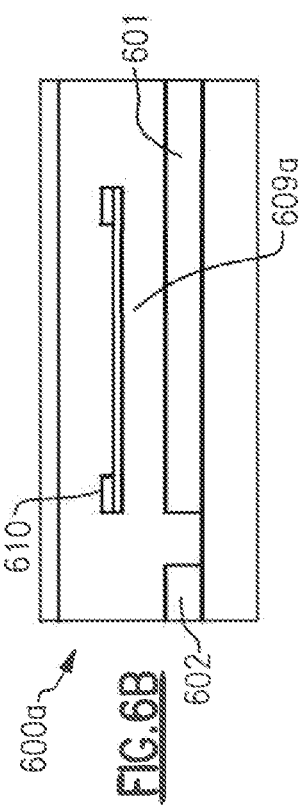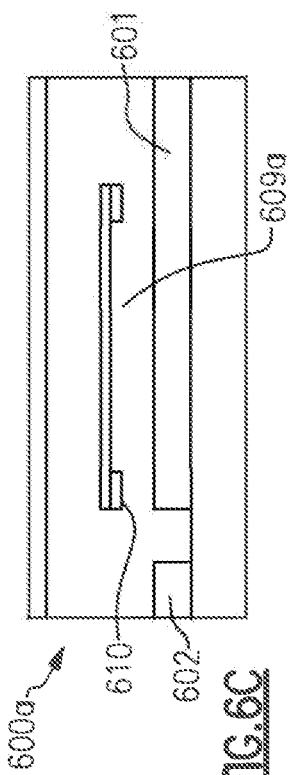

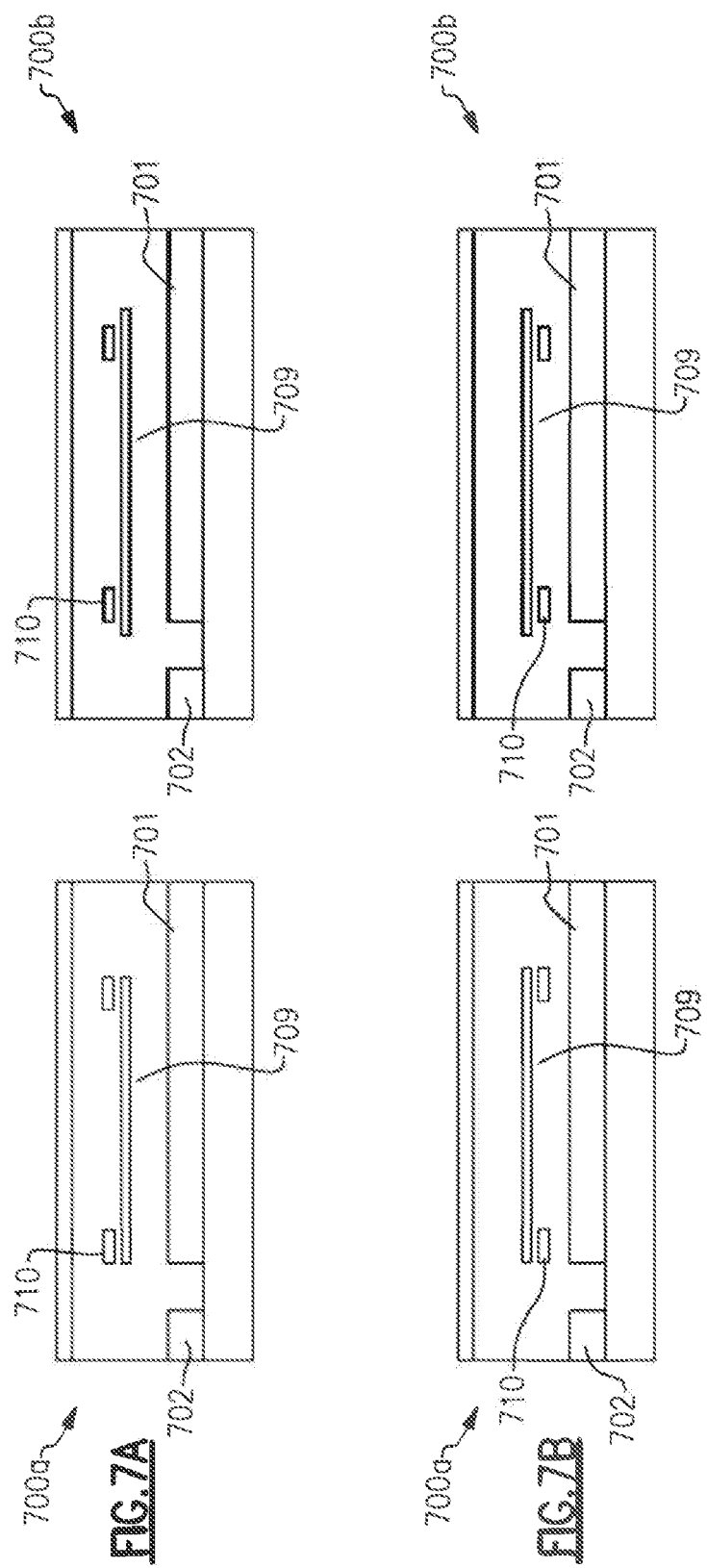

LOW VELOCITY SURFACE ACOUSTIC WAVE DEVICE

CROSS-REFERENCE TO RELATED APPLICATIONS

This application claims priority under 35 U.S.C. § 119(e) to U.S. Provisional Patent Ser. No. 63/228,774, titled "LOW VELOCITY SURFACE ACOUSTIC WAVE DEVICE," filed Aug. 3, 2021, the entire contents of which being incorporated herein by reference for all purposes.

FIELD

Aspects and embodiments disclosed herein relate to low velocity surface acoustic wave (SAW) devices, in particular miniaturized SAW filters and resonators utilizing a low velocity layer disposed in a temperature compensation layer above a SAW generator to lower the velocity of the waves generated.

DESCRIPTION OF THE RELATED TECHNOLOGY

SAW devices such as SAW filters and resonators are commonly used in mobile communication devices such as mobile telephones to define frequency bands at which the device transmits and receives signals. It is advantageous to include multiple features within a mobile communication device while maintaining or reducing the space occupied by the electronic circuitry of the device. It is therefore advantageous to reduce the size of the SAW device or devices in the mobile communication device to create a miniaturized SAW device.

SAW devices may comprise a plurality of electrodes arranged as interleaved fingers on top of a piezoelectric substrate and attached to one or more busbars linking a subset of the electrodes together. The SAW device generates acoustic waves which propagate across the piezoelectric substrate between the electrodes. To account for a proportional relationship between the temperature of the SAW device and its frequency response band, a layer of temperature coefficient of frequency (TCF) compensating material is disposed atop the piezoelectric substrate and the electrodes. The TCF layer may also be referred to as a temperature compensation layer.

SUMMARY

According to one embodiment there is provided a low velocity surface acoustic wave device. The surface acoustic wave device comprises a piezoelectric substrate, an interdigital transducer disposed on the piezoelectric substrate and configured to generate a surface acoustic wave in response to an electrical signal, and a temperature compensation layer disposed on the interdigital transducer and on the piezoelectric substrate, the temperature compensation layer having a low velocity layer disposed within it configured to reduce the velocity of a surface acoustic wave generated by the interdigital transducer.

In one example the interdigital transducer comprises a pair of busbars disposed on opposite edges of the piezoelectric substrate.

In one example each busbar has a plurality of electrode fingers extending therefrom towards the opposing busbar.

In one example the electrode fingers of each busbar interleave with one another at a first region of the surface acoustic wave device and form a gap region between the end of one of the plurality of electrode fingers and the opposing busbar.

In one example wherein the first region comprises a central region and two edge regions, each edge region extending from the tip of one plurality of electrode fingers towards the center of the central region.

In one example the low velocity layer covers the first region.

In one example the low velocity layer extends at least partially into the gap region.

In one example the low velocity layer extends at least partially into the gap region by a distance of at least 0.05 wavelengths of the surface acoustic wave generated by the interdigital transducer.

In one example the low velocity surface acoustic wave device further comprises a second low velocity layer.

In one example the low velocity surface acoustic wave device further comprises a high velocity layer.

In one example the low velocity surface acoustic wave device further comprises a passivation layer disposed on the temperature compensation layer.

In one example the passivation layer is a high velocity layer.

In one example the passivation layer extends only in the first region.

In one example the low velocity surface acoustic wave device further comprises an additional strip of low velocity layer disposed at the edge regions.

In one example, each additional strip of low velocity layer is in contact with the low velocity layer.

In one example, each additional strip of low velocity layer is spaced apart from the low velocity layer.

In one example, each additional strip of low velocity layer is above the low velocity layer.

In one example, each additional strip of low velocity layer is below the low velocity layer.

In one example the electrode fingers have areas of increased width where the tip of each electrode finger and the edge region intersect.

In one example the gap between each electrode finger and the interleaving adjacent electrode finger is equivalent to at least one wavelength of the surface acoustic wave generated by the interdigital transducer.

According to another embodiment there is provided a method of reducing the velocity of a surface acoustic wave generated by a surface acoustic wave device. The method comprises disposing a low velocity layer within a temperature compensation layer of the surface acoustic wave device.

According to another embodiment there is a method of providing a reduced velocity surface acoustic wave. The method comprises disposing an interdigital transducer on a piezoelectric substrate, disposing a temperature compensation layer on the interdigital transducer, and disposing a low velocity layer within the temperature compensation layer.

In one example the low velocity layer substantially overlays the interdigital transducer when viewed from above.

In one example the method further comprises disposing a second low velocity layer within the temperature compensation layer such that the first low velocity layer is disposed between the second low velocity layer and an interdigital transducer of the surface acoustic wave device.

In one example the method further comprises disposing a high velocity layer within the temperature compensation layer such that the first low velocity layer is disposed between the high velocity layer and an interdigital transducer of the surface acoustic wave device.

In one example the high velocity layer substantially overlays the interdigital transducer when viewed from above.

In one example the low velocity layer is constructed from any one of tungsten, platinum, gold, copper, zinc, silver, molybdenum, tantalum oxide, ruthenium oxide, tungsten oxide, indium oxide, lead oxide, hafnium oxide, or iridium oxide.

In one example the high velocity layer is constructed from any one of diamond, silicon nitride, aluminum oxide, or aluminum nitride.

In one example the high velocity layer is a passivation layer disposed on top of the surface acoustic wave device.

According to another embodiment there is provided a filter. The filter comprises a plurality of low velocity surface acoustic wave devices, each of the plurality of low velocity surface acoustic wave devices including a piezoelectric substrate, an interdigital transducer disposed on the piezoelectric substrate and configured to generated a surface acoustic wave in response to an electrical signal, and a temperature compensation layer disposed on the interdigital transducer and on the piezoelectric substrate, the temperature compensation layer having a low velocity layer disposed within it and configured to reduce the velocity of a surface acoustic wave generated by the interdigital transducer.

According to another embodiment there is provided a front end module for installation in a wireless device. The front end module comprises a low velocity surface acoustic wave device, the low velocity surface acoustic wave device including a piezoelectric substrate, an interdigital transducer disposed on the piezoelectric substrate and configured to generated a surface acoustic wave in response to an electrical signal, and a temperature compensation layer disposed on the interdigital transducer and on the piezoelectric substrate, the temperature compensation layer having a low velocity layer disposed within it and configured to reduce the velocity of a surface acoustic wave generated by the interdigital transducer.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 1A is a prior art SAW device using a conventional electrode material;

FIG. 1B is a prior art low velocity SAW device using heavy electrodes;

FIG. 1C is a comparison of the displacement of the SAW generated in the prior art SAW device of FIG. 1A and the low velocity SAW device of FIG. 1B;

FIG. 1D is a comparison of the TCF of the SAW generated in the prior art SAW device of FIG. 1A and the low velocity SAW device of FIG. 1B;

FIG. 1E is an illustration of the admittance and quality factor of the low velocity SAW device of FIG. 1B;

FIG. 2A is a plan view of an example of a low velocity SAW device according to aspects of the present invention;

FIG. 2B is a cross-sectional view of an example of a low velocity SAW device according to aspects of the present invention;

FIG. 6A is a plan view of an example of a low velocity SAW device showing a low velocity layer having a region of increased thickness according to aspects of the present invention;

FIG. 6B is a cross-sectional view of an example of a low velocity SAW device showing a low velocity layer having a region of increased thickness according to aspects of the present invention;

FIG. 6C is a cross-sectional view of an example of a low velocity SAW device showing a low velocity layer having a region of increased thickness according to aspects of the present invention;

FIG. 7A is a cross-sectional view of an example of a low velocity SAW device showing a low velocity layer having a proximal material strip according to aspects of the present invention;

FIG. 7B is a cross-sectional view of an example of a low velocity SAW device showing a low velocity layer having a proximal material strip according to aspects of the present invention;

DETAILED DESCRIPTION

Figure 3A:
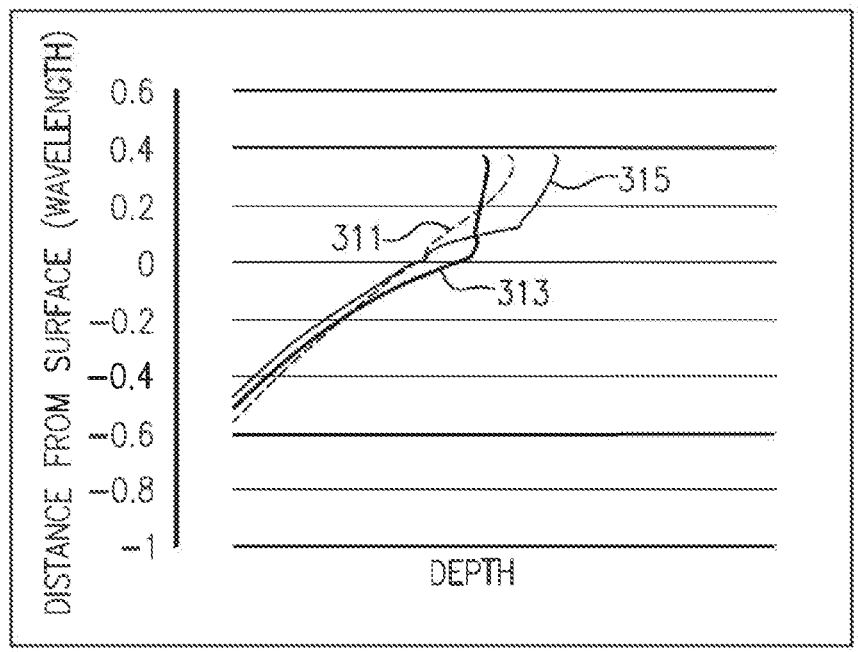
FIG. 3A is a comparison of the displacement of the SAW generated in the prior art SAW devices of FIGS. 1A and 1B and the low velocity SAW device of FIG. 3A.

Aspects and embodiments described herein are directed to a low velocity SAW device and a method of lowering the velocity of surface acoustic waves in a SAW device which allow for low velocity surface acoustic waves to be generated, so that the low velocity SAW device can be miniaturized, and so that the surface acoustic waves are not influenced by temperature changes, allow for propagation of the wave above a piezoelectric substrate of the SAW device, and have minimal interferences from shear horizontal (SH) mode waves.

The method of reducing the velocity of a surface acoustic wave generated by a surface acoustic wave device includes disposing a low velocity layer within a temperature coefficient of frequency compensation layer (TCF layer or temperature compensation layer) of a surface acoustic wave device. This low velocity layer reduces the speed of propagation of the waves through the device, and also increases the displacement of the waves above the surface of the piezoelectric substrate, thereby increasing the effect of the TCF layer and decreasing the interference effect of SH mode waves on the desired waves of the SAW device.

The low velocity SAW device includes a carrier substrate, a piezoelectric layer disposed on the carrier substrate, an interdigital transducer disposed on the piezoelectric substrate and configured to generate a surface acoustic wave in response to an electrical signal, a TCF layer disposed partially on the interdigital transducer and partially on the piezoelectric substrate, the TCF layer having a low velocity layer disposed within it and configured to reduce the velocity of a surface acoustic wave generated by the interdigital transducer.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1A shows a prior art SAW device 100a which is not suitable for miniaturization, as the speed of propagation of surface acoustic waves through the device is too great for a minimum number of cycles of the SAW to pass between a first electrode 101a and a second electrode 101a. In this device, three electrodes are shown as elements 101a disposed on a piezoelectric substrate 103a. Disposed on both the electrodes 101a and the piezoelectric substrate 103a, and disposed between each electrode 101a, is a temperature coefficient of frequency compensation layer, known herein as a TCF layer 105a. A passivation layer 107a is disposed atop the TCF layer 105a.

The electrodes are arranged with every other electrode connected to one busbar, and the remaining electrodes connected to an opposite busbar, which is shown more clearly in FIG. 2A. Each set of electrodes connected to a busbar comprises an interdigital transducer (IDT).

The SAW device 100a has a piezoelectric substrate 103a which can be made from lithium niobate (LN) crystal, or of any other suitable piezoelectric material. The electrodes 101a disposed on the substrate 103a are made from a relatively light metal, such as molybdenum, however a number of electrode materials can be used, such as aluminum, tungsten, copper, gold, silver, platinum, ruthenium, and/or iridium. The TCF layer may be made from silicon dioxide, however, a number of other dielectric materials having a TCF property may be used, such as tellurium dioxide or aluminum nitride. The passivation layer may be made from SiN, or any other suitable passivation material such as aluminum oxide, silicon dioxide, or SiON. FIG. 1B shows a prior art low velocity SAW device 100b which uses a heavy metal electrode 101b, formed from a relative heavy metal such as tungsten.

To ensure that the SAW device works reliably, a number of wave cycles must be able to propagate between adjacent electrodes. Thus, there is traditionally a tradeoff between the size of the SAW device, and in turn the distance between the electrodes, and the effectiveness of the filter.

To overcome this, the wavelength of the surface acoustic wave can be reduced so that an optimal number of wave cycles can propagate between adjacent electrodes when the SAW device is miniaturized. This reduction in wavelength is achieved by reducing the velocity of the wave in accordance with the relationship between wave velocity, wavelength and frequency.

The prior art SAW device 100b also comprises the same components as the prior art SAW device 100a, such as the piezoelectric material 103b, the TCF layer 105b and the passivation layer 107b.

The prior art low velocity SAW device of FIG. 1B uses the mechanical properties of the heavier metal to produce a low velocity surface acoustic wave. This exploits the relationship between speed, wavelength and frequency thus:

$$v = \lambda \times f$$

For a given frequency of wave, therefore, a reduction in wave velocity causes a reduction in wavelength of the resultant wave. This means that an optimum number of wave cycles, such as 1 wave cycle, can be propagated between adjacent electrodes on the same busbar, or ½ wave cycle between adjacent electrodes of opposing busbars. This is to say that the spacing between adjacent electrodes on the same busbar is at least $\lambda$. From this it can be seen that to reduce the physical size of the SAW device, a smaller wavelength SAW is needed.

However, there are problems with this method of reducing the wavelength of the SAW.

The use of heavy electrodes concentrates the SAW on the piezoelectric substrate, i.e., the height of the wave is reduced and the propagation relies more heavily on the piezoelectric substrate. Thus, the electrodes disposed on the piezoelectric substrate interfere with the wave to a greater extent than a SAW produced with a lighter conventional electrode. This concentration of the SAW on the piezoelectric substrate also reduces the effect of the TCF compensation layer, making it difficult to achieve a SAW device which has zero TCF. In addition, transverse mode waves, or shear horizontal (SH) waves, which can interfere with the desired surface acoustic waves, may be generated at a frequency which interferes with the frequency response band of the SAW device, thus reducing the reliability and precision of the SAW device.

FIG. 1C shows a comparison of the displacement, or distance from the surface of the piezoelectric substrate of the SAW between the prior art SAW device 100a, denoted by line 111, and the prior art SAW device 100b denoted by line 113. The axes show depth of the wave along the bottom and displacement of the wave along the side. The depth of the SAW created by the heavier electrode, as shown by line 113, is capped once the displacement of the wave reaches zero (the surface of the piezoelectric substrate). In comparison, the depth of the wave created by the normal electrode increases past the surface of the piezoelectric substrate as shown by line 111. This graph shows that creating low velocity SAWs using the SAW device 100b results in a deterioration of the response of the SAW device, even compared to the standard SAW device 100a.

FIG. 1D shows a comparison of the effectiveness of the TCF layer on the prior art SAW device 100a, denoted by line 117, and the prior art SAW device 100b denoted by line 119. The axes show depth of the TCF layer along the bottom and the effect of the TCF layer along the side. The TCF effect of the TCF layer for the prior art SAW device of FIG. 1A increases as the thickness of the TCF layer increases to a point where there is no temperature effect on the device. However, the TCF effect of the TCF layer for the low velocity prior art SAW device of FIG. 1B never reaches a point where there is no temperature effect, and so with the use of heavy electrodes alone it is difficult to create a SAW device which is not affected by temperature.

FIG. 1E shows the admittance and quality factor of the prior art low velocity SAW device used as a SAW filter, with the admittance line showing a peak response at point 123 and a SH mode wave at point 121. The x axis of this graph is frequency, and it can be seen that the admittance and quality factor both change with respect to frequency. The quality factor of the prior art SAW device 100b is illustrated by the Q line, where it can be seen there are significant ripples 125 in the quality of the filter response.

It can be seen from the above that the prior art SAW device 100b is not suitable as a SAW filter for general use due to its limitations on temperature and operating response.

FIGS. 2A and 2B illustrate in a plan view and cross-sectional view, respectively, a low velocity SAW device 200 according to an aspect of the present invention. Similar to the prior art SAW devices 100a and 100b, the SAW device 200 includes a set of electrodes 201 disposed on a piezoelectric substrate 203 with a TCF layer 205 or temperature compensation layer disposed thereon and passivation layer 207 disposed atop the TCF layer. In addition, a low velocity layer 209, or low velocity middle layer (LVML) is present above the electrodes 201. This low velocity layer causes the speed of propagation of the SAW generated by electrodes 201 to be reduced, and thus allows for the device to be miniaturized. In addition, the low velocity layer controls the displacement of the SAW so that it propagates above the surface of the piezoelectric substrate and thereby increases the effect of the TCF layer.

FIG. 2A is a plan view of the low velocity SAW device 200. FIG. 2A shows the electrodes 201 connected to their respective busbars 202, with the low velocity layer 209 positioned over the electrodes. As noted above, each combination of a number of electrodes attached to one busbar constitutes an IDT.

All of the plan view figures are representative of a portion of the SAW device, and the IDTs and the low velocity layer can extend further than shown in the figures. Furthermore, the extent of the low velocity layer 209 is shown such that it extends between the tips of opposite electrodes 201, however the low velocity layer can extend further towards the busbars, or extend less such that the tips of the electrodes are not covered by the low velocity layer 209, as will be discussed with reference to the later figures.

The low velocity layer can be made of or include tungsten, or other heavy metals, metal oxides, or other suitable materials such as Pt, Au, Cu, Zn, Ag, Mo, $Ta_2O_5$, $RuO_2$, $WO_3$, $In_2O_3$, PbO, $HfO_2$, or $IrO_2$, including materials with a higher density that $SiO_2$.

Also shown in FIG. 2A are a set of marks delineating regions of the SAW device 200, which are helpful for understanding modifications of the SAW device below. The central region, marked "C" is where the majority of the overlap between electrodes and the low velocity layer occurs. The regions marked "E" are the edge regions, which denote the edge region of the overlap between the electrodes and the low velocity layer. The next regions outside the edge regions are the gap regions, marked "G", which denotes the gap between the end of each electrode and the opposing busbar. Lastly, the region marked "B" denotes the busbar region.

FIG. 3A shows a comparison of the SAW displacement of the prior art SAW devices 100a and 100b, as per FIG. 1C, denoted by lines 311 and 313, with an additional comparison of the low velocity SAW device 200, denoted by line 315. As in FIG. 1C the axes show depth of the wave along the bottom and displacement of the wave along the side. It can be seen from line 315 that the depth of the SAW generated by the low velocity SAW device 200, which comprises the LVML, increases once the displacement of the wave is at 0—the surface of the piezoelectric material. This shows that the wave is displaced to an extent above the surface of the piezoelectric substrate. This effect is caused by the low velocity middle layer.

Figure 3B:
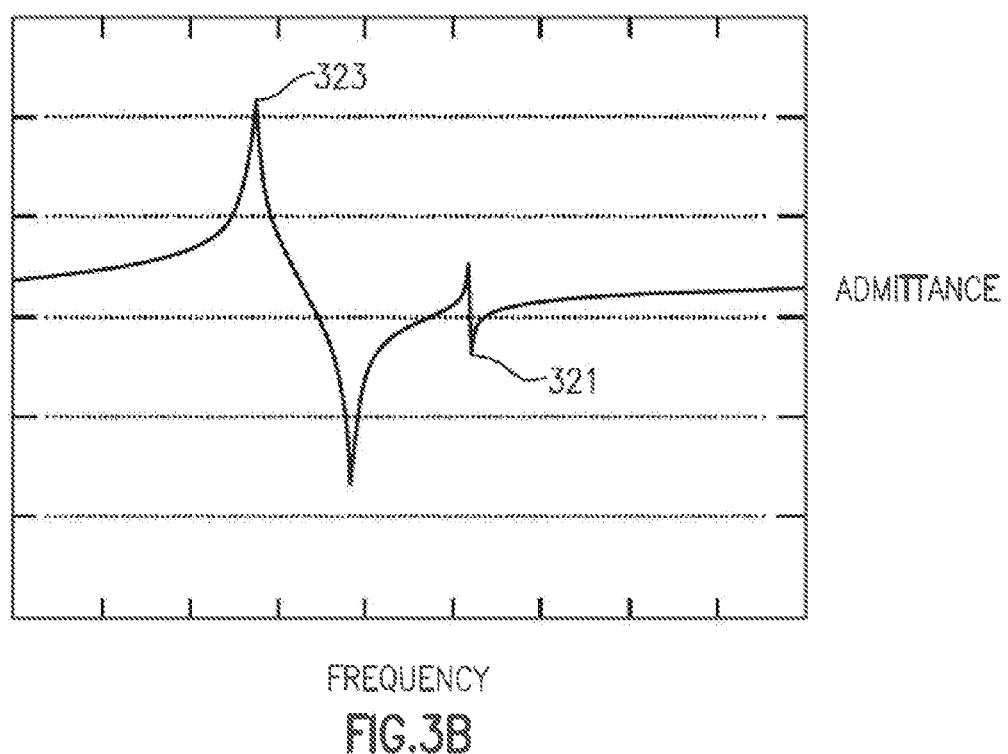
FIG. 3B is an illustration of the admittance of the low velocity SAW device of FIG. 2A.

FIG. 3B shows a second advantageous effect of the low velocity SAW device having a LVML, which is that, as described above, the undesired SH mode response ripple 321 is displaced further along the frequency axis than the desired response 323 of the SAW device. Thus the SH mode response does not interfere with the operation of the SAW device. This is in comparison to the graph shown in FIG. 1E which shows the SH mode response 121 in very close proximity to the desired response 123 in the prior art low velocity SAW device. As with FIG. 1E the x axis of this graph is frequency, and it can be seen that the admittance and quality are both shown changing with respect to frequency.

The graphs in FIGS. 3A and 3B clearly show how the SAW device 200 generates low velocity waves which have no interference from SH mode waves, and which allow sufficient temperature coefficient of frequency compensation. These SAW devices are suitable to be miniaturized and provide an improved response over prior art SAW devices which are suitable to be miniaturized.

The principle shown by the low velocity SAW device 200 is essentially the inclusion of a wave speed propagation altering material, in this sense a low velocity layer (LVML) within a TCF layer of the SAW device. It has been found that the speed of wave propagation can be reduced without interfering with the electrodes of the IDT, and that this can also improve the reliability and response of the SAW device.

One of the numerous effects of the LVML is that more of the SAW occurs above the surface of the piezoelectric substrate. This allows for greater functional use of the piezoelectric substrate because portions covered by the electrodes of the IDT are now available for propagation. Furthermore, this means that more of the wave is located within the TCF layer, which allows for a greater temperature coefficient of frequency correction to be applied to the wave. In comparison with the prior art SAW device 200b, the waves are propagated and slowed, and not muted as is the case with a heavier electrode. This allows for greater manipulation of the wave itself once it has been generated by the IDT(s).

Figure 4:
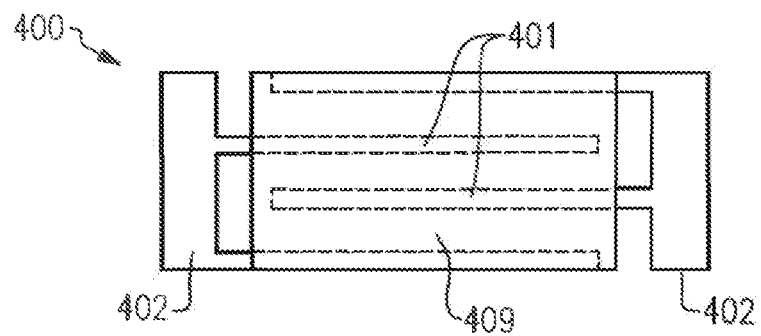
FIG. 4 is a plan view of an example of a low velocity SAW device showing a low velocity layer positioned over the electrodes extending into a gap region according to aspects of the present invention.

FIG. 4 shows an advantageous improvement to the low velocity SAW device having a LVML 409 as described with reference to FIGS. 2A-2B and 3A-3B. In FIG. 4, which is a plan view of a low velocity SAW device 400, the LVML 409 not only covers the portion of the device where the electrodes 401 intersect, but also extends into the gap region of the SAW device 400.

The operation of the SAW device is to generate waves at a first electrode, and have these waves received by a second, or indeed the first (by reflection) electrode. To interact between electrodes, the desired waves are transmitted laterally, from the long sides of the electrodes. It is not, however, possible to restrict waves to these long edges, and waves propagate from the ends of the electrodes as well. The waves that propagate from the ends of the electrodes reflect off the busbars and cause a wave which propagates transversely to the desired wave, creating a shear horizontal (SH) mode wave. It is desirable to reduce the interaction of these SH mode waves with the desired (Rayleigh) waves at the response frequency of the SAW device.

In a conventional SAW device, such as the SAW device 100a, the velocity of the SAW is matched to the propagation speed of the gap region, however when the velocity of the SAW is reduced, this matching is lost, and SH mode waves can begin to interfere with the operation of the device. To counteract this, the LVML can be used to control the speed of wave propagation in this gap region so that the SH mode response is reduced.

The maximum extent to which the SH mode response is reduced is achieved where the LVML extends at least 0.05λ over the edge of the electrode tips.

Figure 5A:
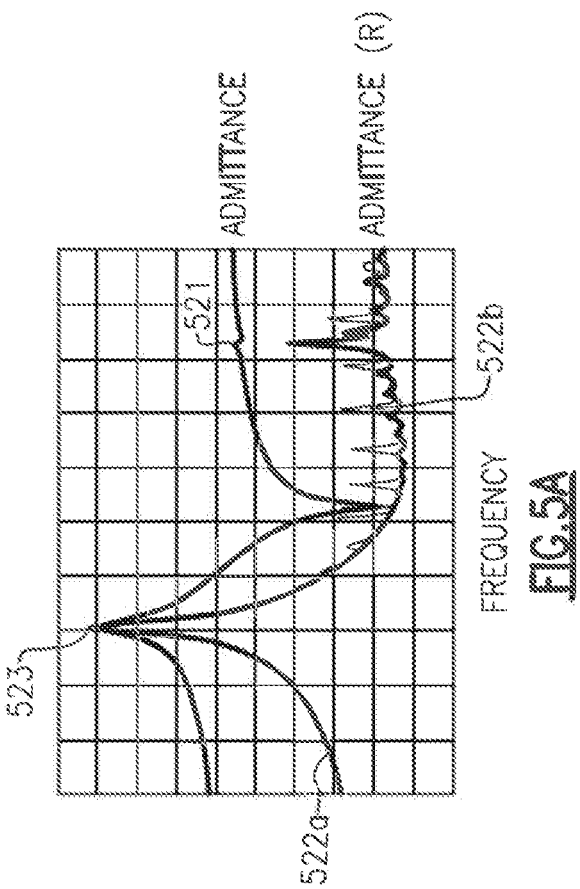
FIG. 5A is a comparison of the admittance of the low velocity SAW device of FIG. 2 and the low velocity SAW device of FIG. 4.
Figure 5B:
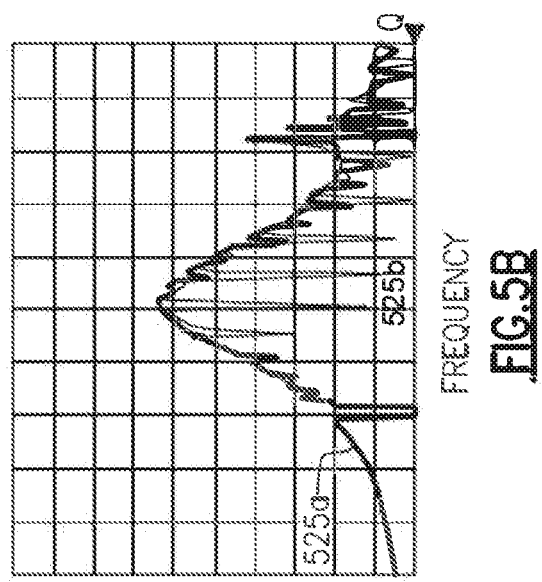
FIG. 5B is a comparison of the quality factor of the low velocity SAW device of FIG. 2 and the low velocity SAW device of FIG. 4.

The effect of this is shown in FIGS. 5A and 5B. FIG. 5A shows the both the complex and real admittance of the SAW device 400 and the SAW device 200. The complex admittance, labelled admittance, shows no difference between the SAW device 400 and the SAW device 200. However, the real admittance, labelled admittance (R), of the SAW device 400, marked as 522a has far fewer ripples that that of the SAW device 200, marked as 522b. The only visible ripple of magnitude is that which corresponds to the SH mode response at 521 of the admittance chart.

FIG. 5B shows the quality factor as a function a frequency for the SAW devices 200 and 400, where it can be seen that the quality factor curve of the SAW device 200, marked 525a has a number of ripples of high magnitude, whereas the only ripples of magnitude of the quality factor curve of the SAW device 400, marked as 525b correspond to the desired response 523 and the SH mode response 521 of FIG. 5A. Thus, it can be seen that by increasing the width of the low velocity middle layer, as shown in FIG. 4, the quality factor of the low velocity SAW device having a LVML is increased when the LVML 409 extends over the tips of the electrode. This increase in quality factor leads to a reduction in power loss as well as a reduction in signal interference.

The x axes of these graphs are both frequency, and it can be seen that the admittance and quality factor are both shown changing with respect to frequency.

FIGS. 6A-6C are plan and cross-sectional views of a further modification to the SAW filters 200 and 400. FIGS. 6A-6C are arranged in pairs, showing how the modification can be applied to the SAW filter 200 having a narrow LVML 609a and also to the SAW filter 400 having an extended LVML 609b.

The edge region of the LVML 609a or 609b from the tip of each electrode and extending towards the center of the device includes a region of increased thickness, provided by an extra strip of material 610, either above or below the LVML 609a or 609b, which runs the length of the LVML 609a or 609b. The material can be the same material as the LVML such as Tungsten, or any other suitable material, such as Pt, Au, Cu, Zn, Ag, Mo, $Ta_2O_5$, $RuO_2$, $WO_3$, $In_2O_3$, PbO, $HfO_2$, or $IrO_2$, including materials with a higher density that $SiO_2$.

In the cross-sectional views of FIGS. 6B and 6B a busbar 602 is visible opposite the electrode 601, indicating the physical position of the LVML 609a or 609b above the IDTs.

FIGS. 7A and 7B show cross-sectional views of a modification to the SAW devices 600a and 600b of FIGS. 6A-6C. These SAW devices 700a and 700b are largely identical to the SAW devices 600a and 600b, however they demonstrate that the extra strip of material 710 does not need to be touching the LVML 709a or 709b. The benefit of this is the same as the areas of increased thickness of FIGS. 6A-6C, in that SH mode waves can be suppressed and reduced in size, such that any overlap of the SH waves with the desired response is reduced.

Figure 8:
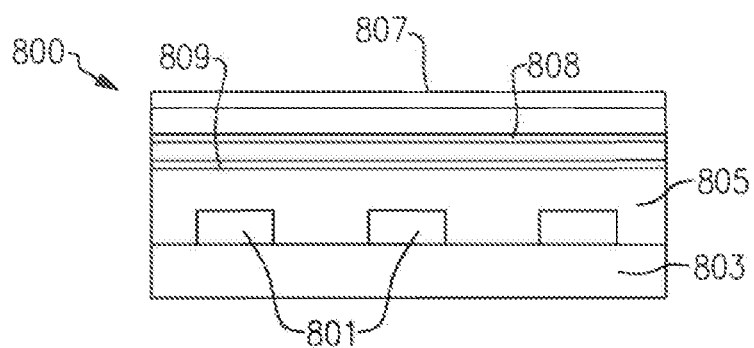
FIG. 8 is a cross-sectional view of an example of a low velocity SAW device according to a further aspect of the present invention which uses multiple low velocity layers.
Figure 9:
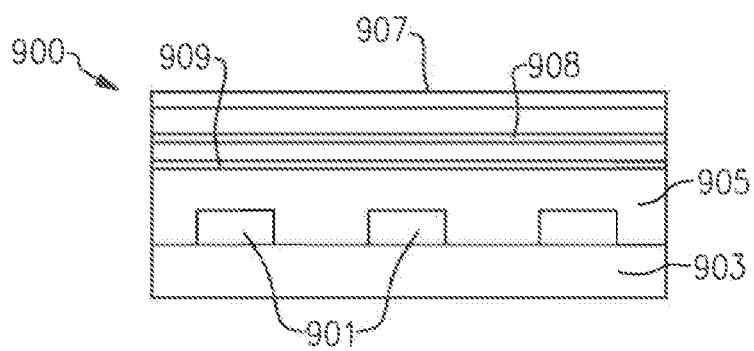
FIG. 9 is a cross-sectional view of an example of a low velocity SAW device according to a further aspect of the present invention which uses multiple velocity modifying layers.

FIGS. 8 and 9 show an advantageous improvement to any of the low velocity SAW filters according to aspects of the present invention. The construction of the SAW device 800 is identical to that of the SAW filter 200 or 400, with a set of electrodes 801, a piezoelectric substrate 803, a TCF layer 805, a passivation layer 807 and a low velocity middle layer 809. In addition to this, in FIG. 8 there is an additional low velocity middle layer 808. The low velocity middle layer 808 can be formed from the same material as the LVML 809, or other suitable materials such as W, Pt, Au, Cu, Zn, Ag, Mo, $T_2O_5$, $RuO_2$, $WO_3$, $In_2O_3$, PbO, $HfO_2$, or $IrO_2$, including materials with a higher density that $SiO_2$. In FIG. 9 an additional high velocity middle layer 908 is disposed in the SAW device 900. This high velocity middle layer 908 can be formed from diamond, SiN, or any other suitable material such as $Al_2O_3$ or AN.

By disposing extra layers of material in the TCF layer of the SAW device the displacement of the SAW generated by the electrodes of the IDT can be adjusted. In the manner that one LVML can raise the displacement of the SAW, and also generate low velocity waves, a desirable balance can be achieved between displacement (and therefore interference and TCF effect) and wave velocity (and therefore miniaturization). As noted above, these layers allow manipulation of the wave once it has propagated which in turn allows greater flexibility of the SAW device.

Figure 10B:
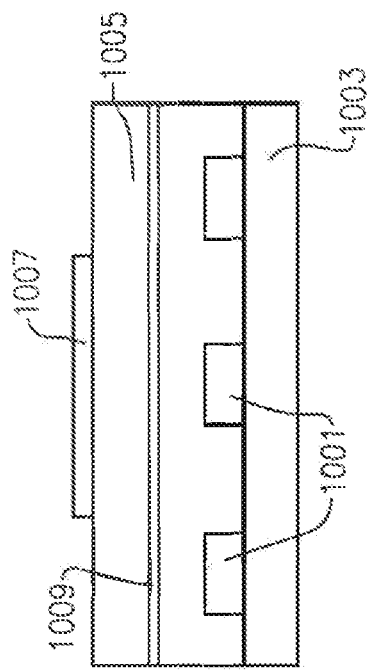
FIG. 10B is a cross-sectional view of an example of a low velocity SAW device including a passivation layer extending over a center region of the SAW device according to aspects of the present invention.
Figure 10A:
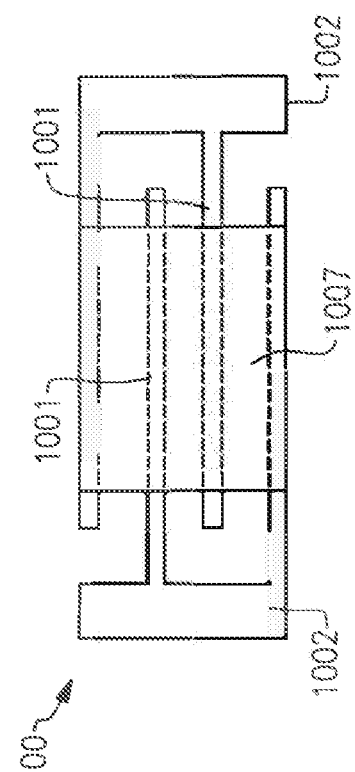
FIG. 10A is a plan view of an example of a low velocity SAW device including a passivation layer extending over a center region of the SAW device according to aspects of the present invention.

FIG. 10A shows a plan view of a SAW device 1000 which is constructionally and functionally similar to the SAW devices 200 and 400. The SAW device 1000 includes IDTs constructed from electrodes 1001 connected to opposing busbars 1002, with a passivation layer 1007 overlaid on top. This plan view excludes the LVML 1009 which is present, however, not shown to avoid confusion with the modified passivation layer 1007.

The passivation layer 1007 is reduced in width so that it covers some but not all of the central region of the SAW device 1000, extending only within the space where the electrodes 1001 overlap, but not covering the electrode tips.

The passivation layer of any of the previously disclosed SAW devices may be formed from a high velocity material, such as SiN, as noted above. As this material is a high velocity material, the removal of the material at the edge and gap regions of the SAW device 1000 can slow down waves in the edge region, the speed of which would usually cause a SH mode response (as discussed above). This can therefore have a similar effect as applying an extra strip of low velocity material at the edge region as shown in FIGS. 6A-6C and 7A-7B.

FIG. 10B is a cross-sectional view of the SAW device 1000, which shows that the passivation layer 1007 is reduced in width and that the LVML 1009 is still present in this aspect of the invention.

Figure 11:
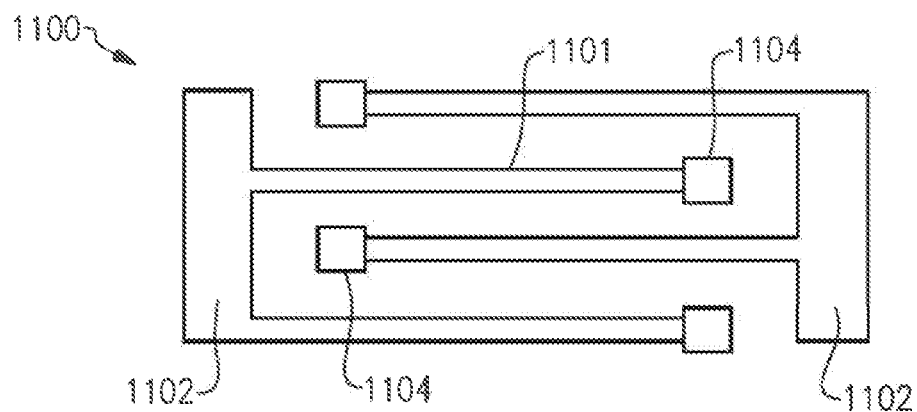
FIG. 11 is a plan view of an example of a low velocity SAW device including a plurality of electrodes with regions of increased thickness at an edge region of the SAW device according to aspects of the present invention.

FIG. 11 is a plan view of a SAW device 1100 which has modified electrodes 1101 in comparison to the SAW device 200 or 400. These modified electrodes have a tip portion 1104 which has an increased width with respect to the remainder of each electrode. As has been explained, using a heavier electrode, such as in the prior art low velocity SAW device 100b, a low velocity wave can be produced. In addition to the using a heavier material to make an electrode, a larger amount of material can be used to increase the mass. In this aspect of the present invention, a wave can be produced with a lower velocity than the desired waves but at the tip of each electrode, thereby reducing the velocity of the SH mode waves. This is achieved by increasing the size of the electrode at the tip, thereby increasing the mass of the tip portion. A similar effect can be achieved by replacing the tip of the electrode with a heavier metal tip, or by increasing the electrode film thickness of the tip, which both provide an increased mass at the tip portion.

Figure 12:
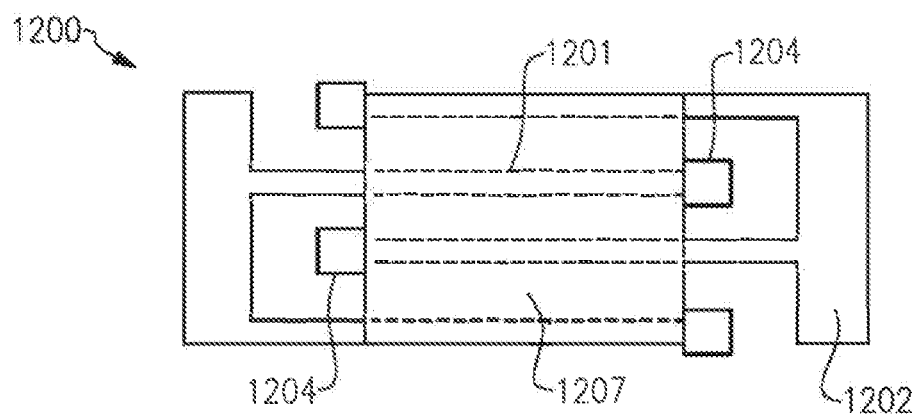
FIG. 12 is a plan view of an example combining the embodiments of FIG. 10 and FIG. 11.

FIG. 12 shows a combination of the SH mode reducing means of the SAW device 1000 and that of SAW device 1100, where the reduction in width of the passivation layer 1207 and the increase in width of the tip section 1204 of the electrodes 1201 are combined to further reduce the SH mode response interference with the desired Rayleigh waves.

It can be seen from the plan view of embodiments of the SAW devices disclosed herein that each low or high velocity layer may substantially overlay the IDTs when viewed from above.

Figure 13:
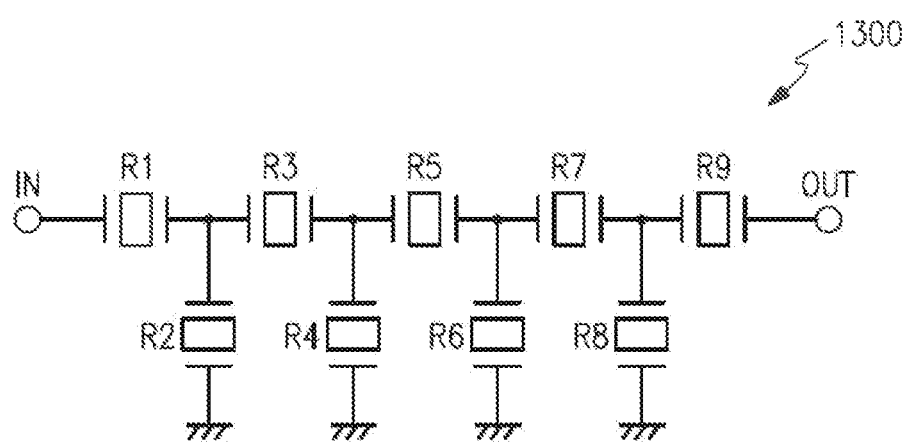
FIG. 13 shows an example of a ladder filter in which multiple low velocity SAW devices according to aspects of the present invention may be combined.

FIG. 13 shows an example of a filter 1300 which multiple SAW resonators as disclosed herein may be combined. FIG. 13 shows an RF ladder filter 1300 including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW devices as disclosed herein.

Figure 14:
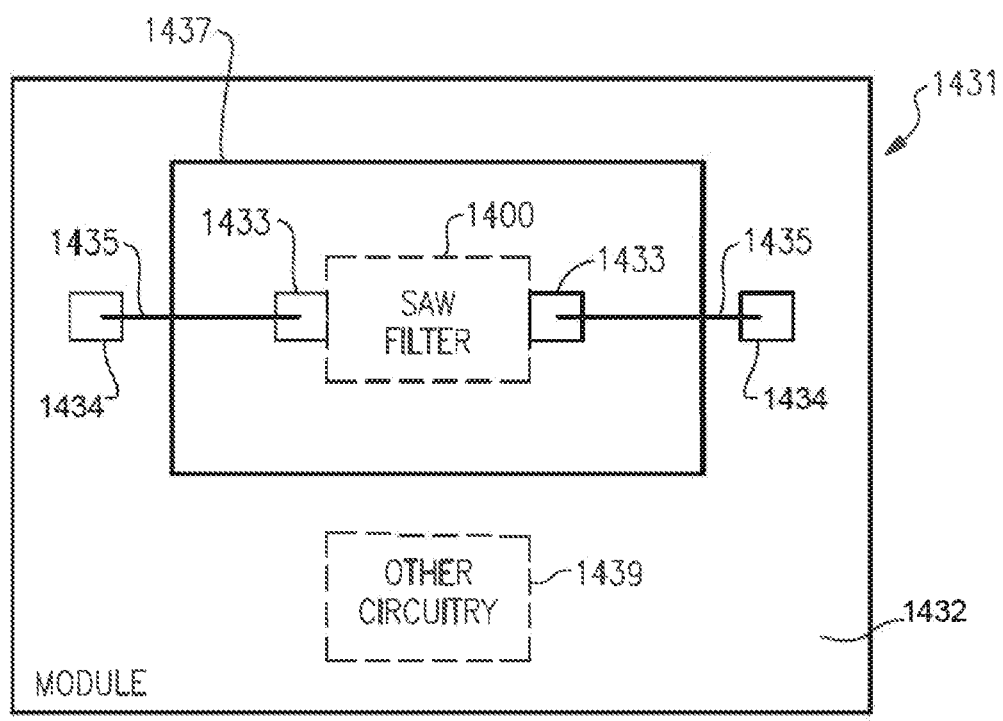
FIG. 14 is a block diagram of one example of a filter module that can include one or more low velocity SAW devices according to aspects of the present disclosure.
Figure 15:
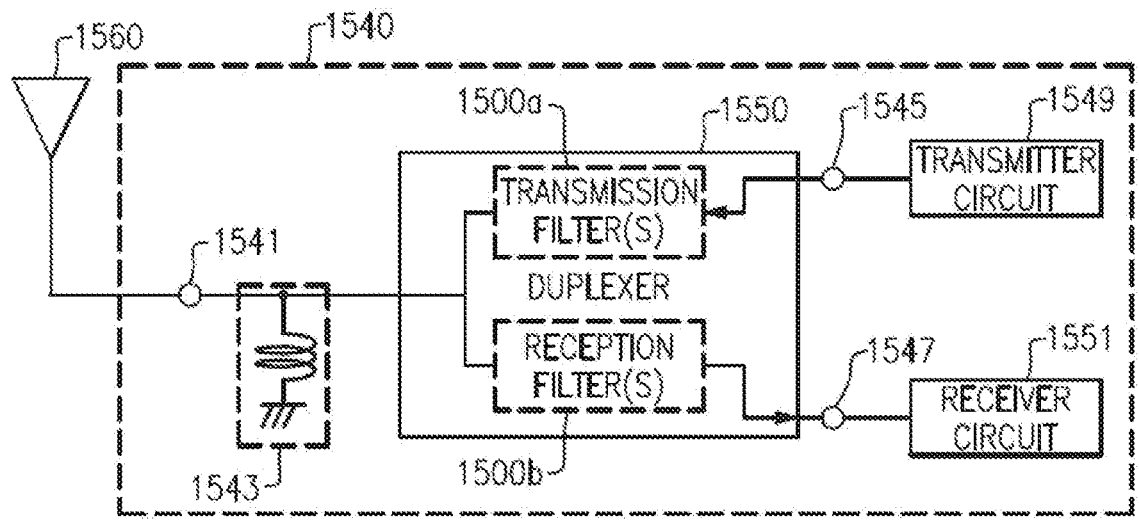
FIG. 15 is a block diagram of one example of a front-end module that can include one or more filter modules including low velocity SAW devices according to aspects of the present disclosure.
Figure 16:
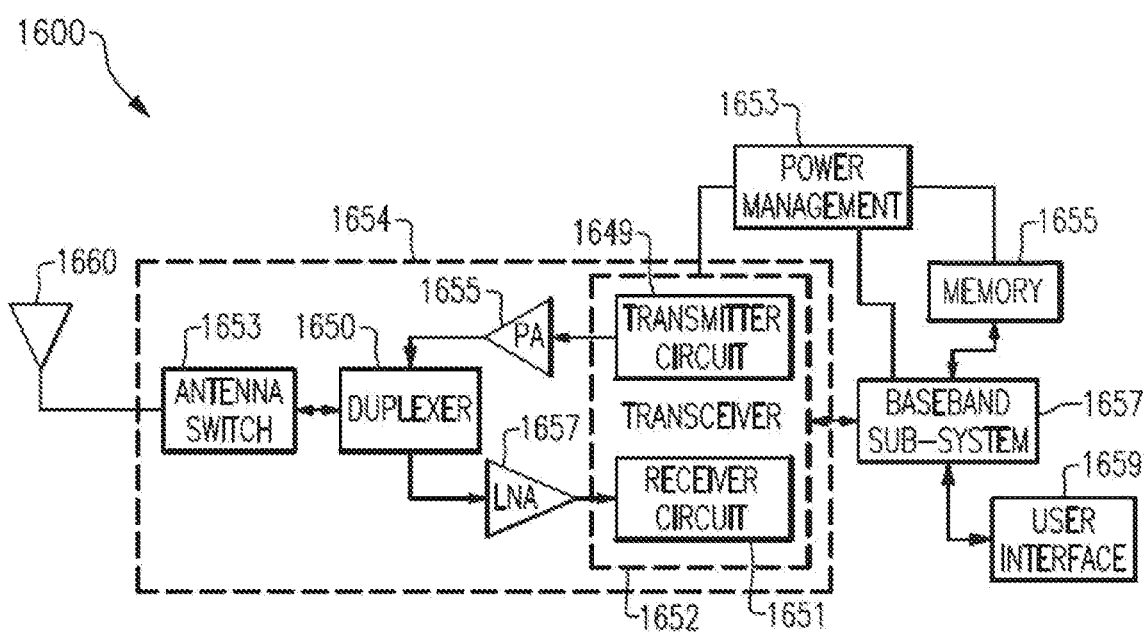
FIG. 16 is a block diagram of one example of a wireless device including the front-end module of FIG. 15.

Moreover, examples and embodiments of SAW devices discussed herein can be implemented in a variety of packaged modules. Some example packaged modules will now be discussed in which any suitable principles and advantages of the SAW resonators discussed herein can be implemented. FIGS. 14, 15, and 16 are schematic block diagrams of illustrative packaged modules and devices according to certain embodiments.

As discussed above, SAW devices, such as those of FIGS. 2, 4 and 6 to 12, can be used in SAW radio frequency (RF) filters. In turn, a SAW RF filter using one or more surface acoustic wave elements, such as the SAW RF filter 1300 of FIG. 13, may be incorporated into and packaged as a module that may ultimately be used in an electronic device, such as a wireless communications device, for example. FIG. 14 is a block diagram illustrating one example of a module 1431 including a SAW device 1400. The SAW device 1400 may be implemented on one or more die(s) 1437 including one or more connection pads 1433. For example, the SAW device 1400 may include a connection pad 1433 that corresponds to an input contact for the SAW filter and another connection pad 1433 that corresponds to an output contact for the SAW filter. The packaged module 1431 includes a packaging substrate 1432 that is configured to receive a plurality of components, including the die 1437. A plurality of connection pads 1434 can be disposed on the packaging substrate 1432, and the various connection pads 1433 of the SAW filter die 1437 can be connected to the connection pads 1434 on the packaging substrate 1432 via electrical connectors 1435, which can be solder bumps or wirebonds, for example, to allow for passing of various signals to and from the SAW device 1400. The module 1431 may optionally further include other circuitry die 1439, for example, one or more additional filter(s), amplifiers, pre-filters, modulators, demodulators, down converters, and the like, as would be known to one of skill in the art of semiconductor fabrication in view of the disclosure herein. In some embodiments, the module 1431 can also include one or more packaging structures to, for example, provide protection and facilitate easier handling of the module 1431. Such a packaging structure can include an overmold formed over the packaging substrate 1432 and dimensioned to substantially encapsulate the various circuits and components thereon.

Various examples and embodiments of the SAW device 1400 can be used in a wide variety of electronic devices. For example, the SAW device 1400 can be used in an antenna duplexer, which itself can be incorporated into a variety of electronic devices, such as RF front-end modules and communication devices.

Referring to FIG. 15, there is illustrated a block diagram of one example of a front-end module 1540, which may be used in an electronic device such as a wireless communications device (e.g., a mobile phone) for example. The front-end module 1540 includes an antenna duplexer 1550 having a common node 1541, an input node 1545, and an output node 1547. An antenna 1560 is connected to the common node 1541.

The antenna duplexer 1550 may include one or more transmission filters 1500a connected between the input node 1545 and the common node 1541, and one or more reception filters 1500b connected between the common node 1541 and the output node 1547. The passband(s) of the transmission filter(s) are different from the passband(s) of the reception filters. Examples of the SAW device 1400 can be used to form the transmission filter(s) 1500a and/or the reception filter(s) 1500b. An inductor or other matching component 1543 may be connected at the common node 1541.

The front-end module 1540 further includes a transmitter circuit 1549 connected to the input node 1545 of the duplexer 1550 and a receiver circuit 1551 connected to the output node 1547 of the duplexer 1550. The transmitter circuit 1549 can generate signals for transmission via the antenna 1560, and the receiver circuit 1551 can receive and process signals received via the antenna 1560. In some embodiments, the receiver and transmitter circuits are implemented as separate components, as shown in FIG. 15, however, in other embodiments these components may be integrated into a common transceiver circuit or module. As will be appreciated by those skilled in the art, the front-end module 1540 may include other components that are not illustrated in FIG. 15 including, but not limited to, switches, electromagnetic couplers, amplifiers, processors, and the like.

FIG. 16 is a block diagram of one example of a wireless device 1600 including the antenna duplexer 1650 shown in FIG. 15. The wireless device 1600 can be a cellular phone, smart phone, tablet, modem, communication network or any other portable or non-portable device configured for voice or data communication. The wireless device 1600 can receive and transmit signals from the antenna 1660. The wireless device includes an embodiment of a front-end module 1654 similar to that discussed above with reference to FIG. 15. The front-end module 1654 includes the duplexer 1650, as discussed above. In the example shown in FIG. 16 the front-end module 1654 further includes an antenna switch 1653, which can be configured to switch between different frequency bands or modes, such as transmit and receive modes, for example. In the example illustrated in FIG. 10, the antenna switch 1653 is positioned between the duplexer 1650 and the antenna 1660; however, in other examples the duplexer 1650 can be positioned between the antenna switch 1653 and the antenna 1660. In other examples the antenna switch 1653 and the duplexer 1650 can be integrated into a single component.

The front-end module 1640 includes a transceiver 1652 that is configured to generate signals for transmission or to process received signals. The transceiver 1652 can include the transmitter circuit 1649, which can be connected to the input node of the duplexer 1650, and the receiver circuit 1651, which can be connected to the output node of the duplexer 1650, as shown in the example of FIG. 15.

Signals generated for transmission by the transmitter circuit 1649 are received by a power amplifier (PA) module 1655, which amplifies the generated signals from the transceiver 1652. The power amplifier module 1655 can include one or more power amplifiers. The power amplifier module 1655 can be used to amplify a wide variety of RF or other frequency-band transmission signals. For example, the power amplifier module 1655 can receive an enable signal that can be used to pulse the output of the power amplifier to aid in transmitting a wireless local area network (WLAN) signal or any other suitable pulsed signal. The power amplifier module 1655 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 1655 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 16, the front-end module 1654 may further include a low noise amplifier (LNA) module 1657, which amplifies received signals from the antenna 1660 and provides the amplified signals to the receiver circuit 1651 of the transceiver 1652.

The wireless device 1600 of FIG. 16 further includes a power management sub-system 1653 that is connected to the transceiver 1652 and manages the power for the operation of the wireless device 1600. The power management system 1653 can also control the operation of a baseband sub-system 1657 and various other components of the wireless device 1600. The power management system 1653 can include, or can be connected to, a battery (not shown) that supplies power for the various components of the wireless device 1600. The power management system 1653 can further include one or more processors or controllers that can control the transmission of signals, for example. In one embodiment, the baseband sub-system 1657 is connected to a user interface 1659 to facilitate various input and output of voice and/or data provided to and received from the user. The baseband sub-system 1657 can also be connected to memory 1655 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A low velocity surface acoustic wave device, comprising:
   a piezoelectric substrate;
   an interdigital transducer disposed on the piezoelectric substrate and configured to generate a surface acoustic wave in response to an electrical signal, the interdigital transducer including a pair of busbars disposed on opposite edges of the piezoelectric substrate, each busbar having a plurality of electrode fingers extending therefrom towards an opposing busbar, the plurality of electrode fingers of each busbar interleaving with one another within a first region of the low velocity surface acoustic wave device and forming a gap region between an end of one of the plurality of electrode fingers and the opposing busbar, the first region including a central region and two edge regions, each edge region extending from a tip of one of the plurality of electrode fingers towards a center of the central region; and
   a temperature compensation layer disposed on the interdigital transducer and on the piezoelectric substrate, the temperature compensation layer having a low velocity material layer disposed within and configured to reduce a velocity of the surface acoustic wave generated by the interdigital transducer, the low velocity material layer wholly covering the first region and extending only partially into the gap region of the low velocity surface acoustic wave device.

2. The low velocity surface acoustic wave device of claim 1 wherein the low velocity material layer extends into the gap region by a distance of at least 0.05 wavelengths of the surface acoustic wave generated by the interdigital transducer.

3. The low velocity surface acoustic wave device of claim 1 further comprising a second low velocity material layer.

4. The low velocity surface acoustic wave device of claim 3 wherein the second low velocity material layer fully overlaps the low velocity layer and is separated from the low velocity layer by a portion of the temperature compensation layer.

5. The low velocity surface acoustic wave device of claim 1 further comprising a high velocity material layer.

6. The low velocity surface acoustic wave device of claim 1 further comprising a high velocity passivation layer disposed on the temperature compensation layer.

7. The low velocity surface acoustic wave device of claim 6 wherein the high velocity passivation layer extends only in the first region.

8. The low velocity acoustic wave device of claim 1 further comprising an additional strip of low velocity material disposed within the two edge regions.

9. The low velocity acoustic wave device of claim 8 wherein the additional strip of low velocity material is in contact with the low velocity material layer.

10. The low velocity acoustic wave device of claim 8 wherein the additional strip of low velocity material is spaced apart from the low velocity material layer.

11. The low velocity acoustic wave device of claim 8 wherein the additional strip of low velocity material is above the low velocity material layer.

12. The low velocity acoustic wave device of claim 8 wherein the additional strip of low velocity material is below the low velocity material layer.

13. The low velocity acoustic wave device of claim 1 wherein the plurality of electrode fingers have areas of increased width where tips of each of the plurality of electrode fingers and a respective one of the two edge regions intersect.

14. The low velocity surface acoustic wave device of claim 1 wherein the low velocity material layer is formed from one of zinc, ruthenium oxide, tungsten oxide, indium oxide, hafnium oxide, or iridium oxide.

15. A method of providing a reduced velocity surface acoustic wave device, comprising:
    disposing an interdigital transducer on a piezoelectric substrate, the interdigital transducer including a pair of busbars disposed on opposite edges of the piezoelectric substrate, each busbar having a plurality of electrode fingers extending therefrom towards an opposing busbar, the plurality of electrode fingers of each busbar interleaving with one another within a first region of the reduced velocity surface acoustic wave device and forming a gap region between an end of one of the plurality of electrode fingers and the opposing busbar, the first region including a central region and two edge regions, each edge region extending from a tip of one of the plurality of electrode fingers towards a center of the central region;
    disposing a temperature compensation layer on the interdigital transducer; and
    disposing a low velocity material layer within the temperature compensation layer, the low velocity material layer wholly covering the first region and extending only partially into the gap region of the reduced velocity surface acoustic wave device.

16. The method of claim 15 wherein the low velocity material layer substantially overlays the interdigital transducer when viewed from above.

17. The method of claim 15 further comprising disposing a second low velocity material layer within the temperature compensation layer such that the low velocity material layer is disposed between the second low velocity material layer and the interdigital transducer.

18. The method of claim 15 further comprising disposing a high velocity material layer within the temperature compensation layer such that the low velocity material layer is disposed between the high velocity material layer and the interdigital transducer.

19. The method of claim 18 wherein the high velocity material layer substantially overlays the interdigital transducer when viewed from above.

20. The method of claim 18 wherein the high velocity material layer is constructed from any one of diamond, silicon nitride, aluminum oxide, or aluminum nitride.

21. The method of claim 15 further comprising disposing a high velocity passivation layer on top of the temperature compensation layer of the reduced velocity surface acoustic wave device.

22. A front end module for installation in a wireless device, comprising a low velocity surface acoustic wave device, the low velocity surface acoustic wave device including:
    a piezoelectric substrate;
    an interdigital transducer disposed on the piezoelectric substrate and configured to generate a surface acoustic wave in response to an electrical signal, the interdigital transducer including a pair of busbars disposed on opposite edges of the piezoelectric substrate, each busbar having a plurality of electrode fingers extending therefrom towards an opposing busbar, the plurality of electrode fingers of each busbar interleaving with one another within a first region of the low velocity surface acoustic wave device and forming a gap region between an end of one of the plurality of electrode fingers and the opposing busbar, the first region including a central region and two edge regions, each edge region extending from a tip of one of the plurality of electrode fingers towards a center of the central region; and a temperature compensation layer disposed on the interdigital transducer and on the piezoelectric substrate, the temperature compensation layer having a low velocity material layer disposed within it and configured to reduce a velocity of a surface acoustic wave generated by the interdigital transducer, the low velocity material layer wholly covering the first region and extending only partially into the gap region of the low velocity surface acoustic wave device.

\* \* \* \* \*

UNITED STATES PATENT AND TRADEMARK OFFICE
CERTIFICATE OF CORRECTION

| | | |
|---|---|---|
| PATENT NO. | : 12,425,000 B2 | Page 1 of 1 |
| APPLICATION NO. | : 17/879116 | |
| DATED | : September 23, 2025 | |
| INVENTOR(S) | : Joji Fujiwara et al. | |

It is certified that error appears in the above-identified patent and that said Letters Patent is hereby corrected as shown below:

In the Specification

Column 10, Line 57, delete "AN" and insert -- AlN --

Signed and Sealed this
Twenty-first Day of October, 2025

John A. Squires
*Director of the United States Patent and Trademark Office*